(12) United States Patent
Qi et al.

(10) Patent No.: US 10,114,283 B2
(45) Date of Patent: Oct. 30, 2018

(54) MASK PLATE, EXPOSURE DEVICE, AND EXPOSURE METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Pengyu Qi, Beijing (CN); Changjun Zha, Beijing (CN); Yanping Wang, Beijing (CN); Dong Wang, Beijing (CN); Jianfeng Yuan, Beijing (CN); Xibin Shao, Beijing (CN); Yan Zhang, Beijing (CN); Jintao Xiao, Beijing (CN); Yangchen Guo, Beijing (CN)

(73) Assignees: BOE TECHNOLOGY GROUP CO., LTD. (CN); BIJING BOE DISPLAY TECHNOLOGY CO., LTD. (CN)

( * ) Notice: Subject to any disclaimer, the term of this patent is extended or adjusted under 35 U.S.C. 154(b) by 0 days.

(21) Appl. No.: 15/309,008

(22) PCT Filed: Mar. 9, 2016

(86) PCT No.: PCT/CN2016/075914
§ 371 (c)(1),
(2) Date: Nov. 4, 2016

(87) PCT Pub. No.: WO2017/049883
PCT Pub. Date: Mar. 30, 2017

(65) Prior Publication Data
US 2018/0203343 A1    Jul. 19, 2018

(30) Foreign Application Priority Data

Sep. 25, 2015 (CN) .......................... 2015 1 0622624

(51) Int. Cl.
G03F 1/38 (2012.01)
G03F 7/00 (2006.01)
(Continued)

(52) U.S. Cl.
CPC .............. *G03F 1/38* (2013.01); *G03F 7/0007* (2013.01); *G03F 7/20* (2013.01); *G03F 7/30* (2013.01);
(Continued)

(58) Field of Classification Search
CPC . G03F 1/38; G03F 1/50; G03F 7/0007; G03F 7/30; G02F 1/1303
(Continued)

(56) References Cited

U.S. PATENT DOCUMENTS 8,741,735 B1    6/2014  Hwang et al.
2003/0077083 A1  4/2003  Yamamoto et al.
(Continued)

FOREIGN PATENT DOCUMENTS

CN    1367407 A    9/2002
CN    102169260 A   8/2011
(Continued)

OTHER PUBLICATIONS

Computer-generated translation of JP 2014-228723 (Dec. 2014).*
(Continued)

*Primary Examiner* — John A McPherson
(74) *Attorney, Agent, or Firm* — Brooks Kushman P.C.

(57)  ABSTRACT

The present disclosure provides a mask plate, an exposure device and an exposure method. The mask plate includes a base plate and a plurality of patterns with openings arranged on the base plate. The base plate includes a first region corresponding to a position where a developing agent has a low concentration in the case that a target substrate is to be developed, and a second region corresponding to a position
(Continued)

where the developing agent has a high concentration in the case that the target substrate is to be developed. In the case that the target substrate is exposed using the mask plate, an amount of light beams passing through each pattern at the first region of the base plate is greater than an amount of the light beams passing through each pattern at the second region of the base plate.

10 Claims, 2 Drawing Sheets

(51) Int. Cl.
    *G03F 7/20*     (2006.01)
    *G03F 7/30*     (2006.01)
    *G02F 1/13*     (2006.01)

(52) U.S. Cl.
    CPC ........ *G03F 7/70191* (2013.01); *G02F 1/1303* (2013.01)

(58) Field of Classification Search
    USPC .......................................................... 430/5, 7
    See application file for complete search history.

(56) References Cited

U.S. PATENT DOCUMENTS

| | | | |
|---|---|---|---|
| 2006/0172205 A1* | 8/2006 | Sakurai | ............... G03F 7/70558 430/5 |
| 2012/0190197 A1* | 7/2012 | Hui | ........................... G03F 1/76 438/689 |
| 2014/0145313 A1 | 5/2014 | Li et al. | |
| 2015/0177610 A1* | 6/2015 | Li | ............................ G03F 1/38 430/5 |

FOREIGN PATENT DOCUMENTS

| | | | |
|---|---|---|---|
| CN | 102608859 A | | 7/2012 |
| CN | 103869605 A | | 6/2014 |
| CN | 104062857 A | | 9/2014 |
| CN | 104536258 A | | 4/2015 |
| CN | 204374608 U | | 6/2015 |
| CN | 105116694 A | | 12/2015 |
| EP | 1164438 A1 | | 6/2001 |
| JP | H02213120 A | | 8/1990 |
| JP | 2009244523 A | * | 10/2009 |
| JP | 2014228723 A | * | 12/2014 |

OTHER PUBLICATIONS

Computer-generated translation of JP 2009-244523 (Oct. 2009).*
Chinese First Office Action for Chinese Application No. 201510622624.1, dated Nov. 30, 2016, 8 Pages.
International Search Report and Written Opinion for Application No. PCT/CN2016/075914, dated Jun. 27, 2016, 13 Pages.
Second Office Action for Chinese Application No. 201510622624.1, dated Jul. 3, 2017, 7 Pages.

* cited by examiner

MASK PLATE, EXPOSURE DEVICE, AND EXPOSURE METHOD

CROSS-REFERENCE TO RELATED APPLICATIONS

This application is the U.S. national phase of PCT Application No. PCT/CN2016/075914 filed on Mar. 9, 2016, which claims priority to Chinese Patent Application No. 201510622624.1 filed on Sep. 25, 2015, the disclosures of which are incorporated in their entirety by reference herein.

TECHNICAL FIELD

The present disclosure relates to the field of liquid crystal display technology, in particular to a mask plate, an exposure device and an exposure method.

BACKGROUND

Usually, a color filter (CF) consists of a black matrix (BM), a red-green-blue (RGB) layer, an overcoat (OC)/indium tin oxide (ITO) layer, and a pillar spacer (PS). During the manufacture of the BM, the RGB layer and the PS, an exposure process and a development process need to be performed. Factors that may affect a critical dimension (CD) of an exposure pattern mainly include an exposure amount, a conductivity of a developing agent and an opening width of a mask plate.

The development is performed in an oblique manner, so uneven development may occur. To be specific, during the development, a glass substrate may be oblique, and the developing agent that has taken part in the development may flow toward a lower portion of the glass substrate. At this time, the development agent in the other regions may be diluted, and thus the uneven development may occur. In addition, an exposure machine may be adversely affected by a central light beam, so the exposure pattern at different regions may be exposed at different exposure amounts, and thereby the critical dimension may be adversely affected too.

SUMMARY

An object of the present disclosure is to provide a mask plate, an exposure device and an exposure method, so as to provide an even critical dimension for the product.

In one aspect, the present disclosure provides in some embodiments a mask plate, including a base plate and a plurality of patterns with openings arranged on the base plate. The base plate includes a first region corresponding to a position where a developing agent has a low concentration in the case that a target substrate is to be developed, and a second region corresponding to a position where the developing agent has a high concentration in the case that the target substrate is to be developed. In the case that the target substrate is exposed using the mask plate, an amount of light beams passing through each pattern at the first region of the base plate is greater than an amount of the light beams passing through each pattern at the second region of the base plate, to compensate for a critical dimension at a position corresponding to the second region through the excessive light beams at the first region, thereby to enable an evenness value of the critical dimension to be greater than a predetermined value.

Optionally, an opening width of each pattern at the first region is greater than that of each pattern at the second region.

In another aspect, the present disclosure provides in some embodiments an exposure device, including a mask plate. The mask plate includes a base plate and a plurality of patterns with openings arranged on the base plate. The base plate includes a first region corresponding to a position where a developing agent has a low concentration in the case that a target substrate is to be developed, and a second region corresponding to a position where the developing agent has a high concentration in the case that the target substrate is to be developed. In the case that the target substrate is exposed using the mask plate, an amount of light beams passing through each pattern at the first region of the base plate is greater than an amount of the light beams passing through each pattern at the second region of the base plate, to compensate for a critical dimension at a position corresponding to the second region through the excessive light beams at the first region, thereby to enable an evenness value of the critical dimension to be greater than a predetermined value.

Optionally, an opening width of each pattern at the first region is greater than that of each pattern at the second region.

Optionally, the exposure device further includes a color filter arranged on each pattern, and a light transmittance of the color filter corresponding to the first region is greater than that of the color filter corresponding to the second region.

Optionally, the exposure device further includes a projection module configured to project the light beams toward the first region and the second region in such a manner that the amount of the light beams passing through each pattern at the first region of the base plate is greater than the amount of the light beams passing through each pattern at the second region of the base plate.

Optionally, the base plate further includes a third region and a fourth region, an opening width of each pattern at the third region of the base plate is greater than an opening width of each pattern at the fourth region of the base plate, and an intensity of the light beam projected by the projection module toward the third region is less than that of the light beam projected toward the fourth region.

In yet another aspect, the present disclosure provides in some embodiments an exposure method, including a step of exposing, by the above-mentioned exposure device, a target substrate. The target substrate includes a fifth region and a sixth region. An amount of light beams received at the fifth region is greater than an amount of the light beams received at the sixth region. The fifth region corresponds to the first region of the mask plate, and the sixth region corresponds to the second region of the mask plate.

Optionally, the exposure method further includes a developing step of developing the exposed target substrate.

Optionally, the developing step includes placing the target substrate into a developing agent in such a manner that a distance between the fifth region of the target substrate and a liquid level of the developing agent is greater than a distance between the sixth region of the target substrate and the liquid level of the developing agent.

According to the mask plate, the exposure device and the exposure method in the embodiments of the present disclosure, the mask plate or the exposure device may be improved, so that the amount of the light beams passing through each pattern at one region of the mask plate is greater than the amount of the light beams passing through the patterns at the other region of the mask plate. In the case that the target substrate is immersed in the developing agent during the development, a portion of the target substrate that receives more light beams is located at a position where the developing agent has a low concentration, and a portion of the target substrate that receives fewer light beams is located at a position where the developing agent has a high concentration, so as to increase the critical dimension at the region where an actual critical dimension is smaller than a desired critical dimension, and reduce the critical dimension at the region where an actual critical dimension is greater than the desired critical dimension. As a result, it is able to make an evenness value of the critical dimension on the target substrate greater than the predetermined value, thereby to increase the evenness of the critical dimension.

DETAILED DESCRIPTION

The present disclosure will be described hereinafter in conjunction with the drawings and embodiments. The following embodiments are for illustrative purposes only, but shall not be used to limit the scope of the present disclosure.

Figure 1:
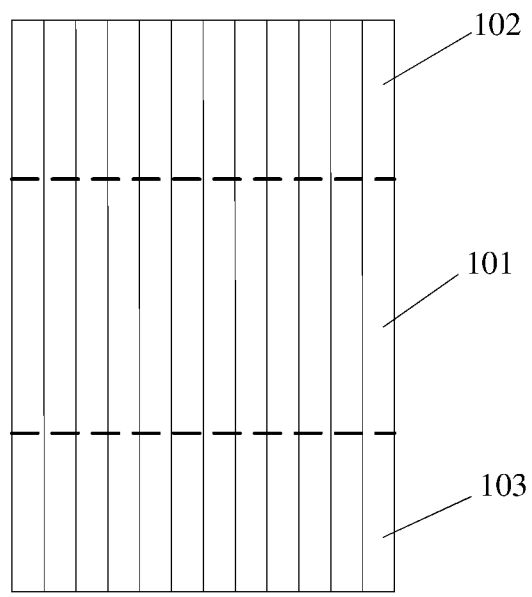
FIG. 1 is a schematic view showing a mask plate according to one embodiment of the present disclosure.

As shown in FIG. 1, the present disclosure provides in some embodiments a mask plate, which includes a base plate and a plurality of patterns 101 with openings arranged on the base plate. The base plate includes a first region 102 corresponding to a position where a developing agent has a low concentration in the case that a target substrate is to be developed, and a second region 103 corresponding to a position where the developing agent has a high concentration in the case that the target substrate is to be developed. In the case that the target substrate is exposed using the mask plate, an amount of light beams passing through each pattern 101 at the first region 102 of the base plate is greater than an amount of the light beams passing through each pattern at the second region 103 of the base plate, so as to compensate for a critical dimension at a position corresponding to the second region 103 through the excessive light beams at the first region 102, thereby to enable an evenness value of the critical dimension to be greater than a predetermined value.

Figure 2:
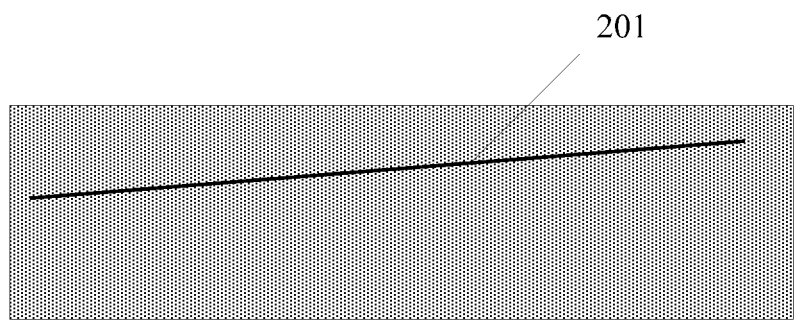
FIG. 2 is a schematic view showing oblique development.

In the related art, due to the oblique development and the uneven illumination of an exposure device, an exposure pattern on the target substrate may have different critical dimensions, and thereby a pattern of a resultant product may have different critical dimensions too. As shown in FIG. 2, in the case that the target substrate 201 is developed, it is placed obliquely, rather than horizontally, in the developing agent. At this time, the developing agent that has taken part in the development may flow downward, and thereby the concentration of the developing agent at a position corresponding to a lower portion of the target substrate 201 may be reduced.

In this regard, in the case that the patterns on the mask plate have an identical critical dimension, the patterns at the lower portion of the target substrate 201 may have a smaller critical dimension, and the patterns at an upper portion may have a greater critical dimension.

Figure 3:
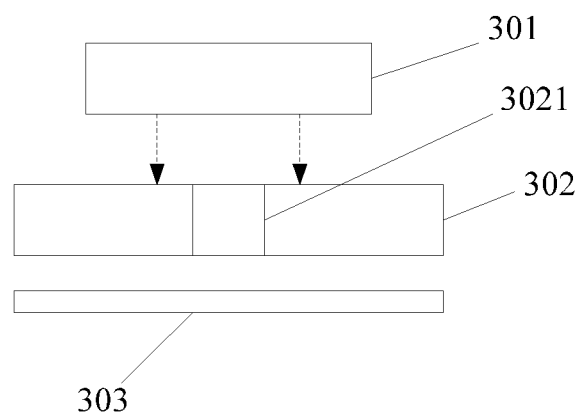
FIG. 3 is a schematic view showing an exposure principle of an exposure device.

The critical dimension of the pattern on the target substrate is also associated with the critical dimension of the pattern on the mask plate. As shown in FIG. 3, which is a schematic view showing the exposure principle of an exposure device for exposing a color filter substrate, a light beam from a projection module 301 may pass through a pattern 3021 with an opening on a mask plate 302 and reach a target substrate 303, so as to expose the target substrate 303. It is found that, the larger the critical dimension of the pattern 3021 on the mask plate 302, the larger the critical dimension of the pattern on the target substrate 303.

In the embodiments of the present disclosure, the light beams may pass through the patterns at different regions of the mask plate at different amounts. In the case of exposing target substrate with the mask plate, the target substrate may receive more light beams at a position corresponding to the first region, and receive fewer light beams at a position corresponding to the second region. During the development, a portion of the target substrate that has received more light beams may be located at a position where the developing agent has a low concentration, and a portion of the target substrate that has received fewer light beams may be located at a position where the developing agent has a high concentration. In other words, in the case that the target substrate is developed, the first region 102 corresponds to the position where the developing agent has a low concentration, and the second region 103 corresponds to the position where the developing agent has a high concentration. As a result, it is able to relieve or prevent the unevenness of the critical dimension due to the oblique target substrate in the developing agent, thereby to provide the pattern on the target substrate with an even critical dimension.

In the embodiments of the present disclosure, the mask plate may be used for manufacturing any product where an exposure process and a development process are required.

In the embodiments of the present disclosure, an evenness value of the critical dimension may refer to any parameter that represents the evenness of the critical dimensions at different positions of the product, e.g., a proportion of the number of the patterns whose critical dimensions meet a predetermined requirement to the total number of the patterns.

In some embodiments of the present disclosure, an opening width of each pattern at the first region is greater than that of each pattern at the second region. In the case of an identical exposure intensity, the larger the opening width of the pattern, the more the light beams that may pass through the pattern.

In the embodiments of the present disclosure, the opening width of each pattern may be determined through experiments. At first, the target substrate may be exposed and developed with a reference mask plate where the patterns have an identical critical dimension, then the critical dimension of each pattern on the target substrate may be measured, and then the critical dimension of each pattern on the reference mask plate may be increased or decreased in accordance with a proportion of the critical dimension of the pattern on the target substrate to the desired critical dimension.

In some other embodiments of the present disclosure, in the case that the critical dimensions of the patterns on the mask plate are not changed, a color filter may be arranged on each pattern, so as to reduce the amount of the light beams passing through the opening of each pattern at the second region. In this way, in the case of an identical exposure intensity and an identical opening, the amount of the light beams passing through each pattern at the first region is greater than the amount of the light beams passing through each pattern at the second region.

The present disclosure further provides in some embodiments an exposure device including a mask plate. The mask plate includes a base plate and a plurality of patterns with openings arranged on the base plate. The base plate includes a first region corresponding to a position where a developing agent has a low concentration in the case that a target substrate is to be developed, and a second region corresponding to a position where the developing agent has a high concentration in the case that the target substrate is to be developed. In the case that the target substrate is exposed using the mask plate, an amount of light beams passing through each pattern at the first region of the base plate is greater than an amount of the light beams passing through each pattern at the second region of the base plate, so as to compensate for a critical dimension at a position corresponding to the second region through the excessive light beams at the first region, thereby to enable an evenness value of the critical dimension to be greater than a predetermined value.

In some embodiments of the present disclosure, an opening width of each pattern at the first region is greater than that of each pattern at the second region.

In some embodiments of the present disclosure, the exposure device further includes a color filter arranged on each pattern, and a light transmittance of the color filter corresponding to the first region is greater than that of the color filter corresponding to the second region.

In some embodiments, the exposure device further includes a projection module configured to project the light beams toward the first region and the second region in such a manner that the amount of the light beams passing through each pattern at the first region of the base plate is greater than the amount of the light beams passing through each pattern at the second region of the base plate. The projection module may be any known projection light source.

In some embodiments of the present disclosure, the base plate further includes a third region and a fourth region, an opening width of each pattern at the third region of the base plate is greater than an opening width of each pattern at the fourth region of the base plate, and an intensity of the light beam projected by the projection module toward the third region is less than that of the light beam projected toward the fourth region. Here, the third and fourth regions may correspond to, or may not correspond to, the first and second regions respectively.

During the actual application, the exposure device may have different exposure intensity at different positions. For example, bright or dark points may occur at a certain exposure region, and the critical dimensions of the patterns at the region of the mask plate corresponding to the region where the abnormal exposure intensity occurs may increase or decrease, so as to compensate for the critical dimension of the pattern on the target substrate.

To be specific, in an optional embodiment of the present disclosure, a first value for compensating for the critical dimension of the pattern on the mask plate may be calculated in accordance with a difference between the critical dimension and the desired critical dimension of the pattern on the target substrate due to different concentrations of the developing agent, and then a second value for compensating for the critical dimension of the pattern on the mask plate may be calculated in accordance with a difference between the critical dimension and the desired critical dimension of the pattern on the target substrate due to different exposure intensities. Next, an actual value for compensating for the critical dimension of the pattern on the mask plate may be calculated in accordance with a sum of the first value and the second value, and then the critical dimension of the pattern on the mask plate may be increased or decreased in accordance with whether the actual value is positive or negative.

During the exposure and development, factors that adversely affect the critical dimension of the pattern on the target substrate may mainly include the critical dimension of the pattern on the mask plate, the concentration of the developing agent, and the exposure intensity. The larger the critical dimension of the pattern on the mask plate, the larger the critical dimension of the pattern on the target substrate. The larger the concentration of the developing agent, the larger the critical dimension of the pattern on the target substrate. The higher the exposure intensity, the larger the critical dimension of the pattern on the target substrate.

In an embodiment of the present disclosure, in order to further improve the evenness of the critical dimension of the pattern on the target substrate, the critical dimension of the pattern on the mask plate at a position corresponding to the position where the developing agent has a low concentration may be changed. In addition, usually most of the exposure devices may include a plurality of light sources arranged in rows, and the target substrate may be exposed through the plurality of light sources using the mask plate. After the critical dimension of the pattern on the mask plate has been changed, it is still probably impossible to provide the pattern on the target substrate with an identical critical dimension. Hence, the exposure intensities of different light sources may be changed, so as to improve the evenness of the critical dimension of the pattern on the target substrate. To be specific, the exposure intensity of the light source corresponding to the region of the target substrate where the critical dimension of the pattern is smaller may be increased, and the exposure intensity of the light source corresponding to the region of the target substrate where the critical dimension of the pattern is larger maybe decreased. In another embodiment of the present disclosure, the critical dimension of the pattern on the conventional mask plate may be increased or decreased, so as to improve the evenness of the critical dimension of the pattern on the target substrate.

The present disclosure further provides an exposure method, which includes a step of exposing, by the above-mentioned exposure device, a target substrate. The target substrate includes a fifth region and a sixth region. An amount of light beams received at the fifth region is greater than an amount of the light beams received at the sixth region. The fifth region corresponds to the first region of the mask plate, and the sixth region corresponds to the second region of the mask plate.

In some embodiments of the present disclosure, the exposure method further includes a developing step of developing the exposed target substrate.

In some embodiments of the present disclosure, the developing step includes placing the target substrate into a developing agent in such a manner that a distance between the fifth region of the target substrate and a liquid level of the developing agent is greater than a distance between the sixth region of the target substrate and the liquid level of the developing agent.

Figure 4A:
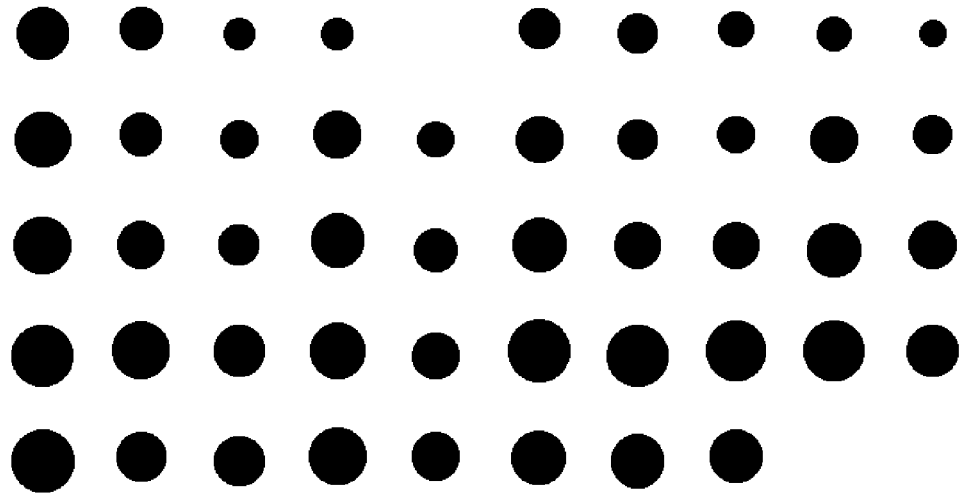
FIG. 4A is a schematic view showing the distribution of patterns with different critical dimensions on a target substrate in the related art.
Figure 4B:
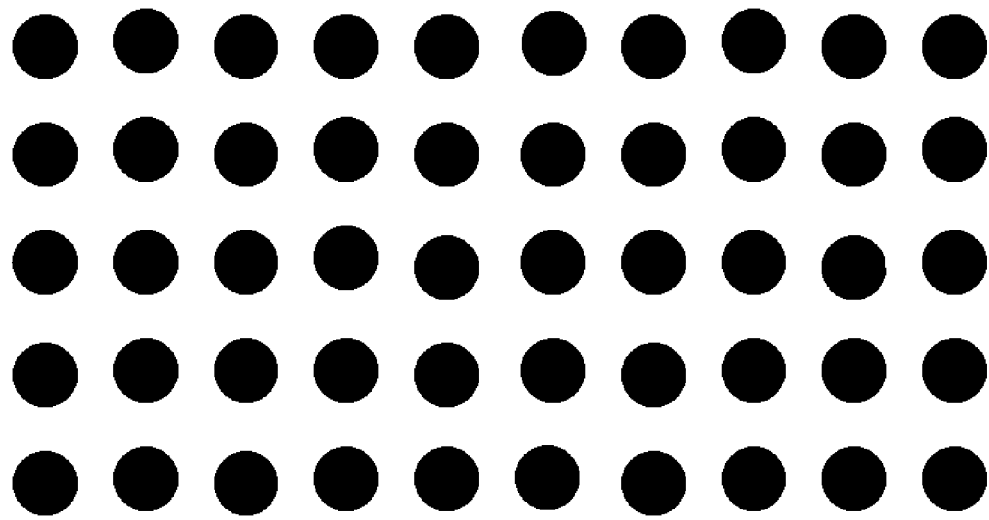
FIG. 4B is a schematic view showing the distribution of the patterns on the target substrate according to one embodiment of the present disclosure.

It is found that, in the embodiments of the present disclosure, it is able to obviously improve the evenness of the critical dimension of the pattern on the target substrate. As shown in FIG. 4A, which is a schematic view showing the distribution of the patterns on the target substrate in the related art, the patterns on the target substrate have different critical dimensions. FIG. 4B is a schematic view showing the distribution of the patterns on the target substrate according to one embodiment of the present disclosure. As can be seen from FIGS. 4A and 4B, in the embodiments of the present disclosure, the evenness of the critical dimension of the pattern on the target substrate have been improved obviously.

According to the mask plate, the exposure device and the exposure method in the embodiments of the present disclosure, the mask plate or the exposure device may be improved, so that the amount of the light beams passing through each pattern at one region of the mask plate is greater than the amount of the light beams passing through the patterns at the other region of the mask plate. In the case that the target substrate is immersed in the developing agent during the development, a portion of the target substrate that receives more light beams is located at a position where the developing agent has a low concentration, and a portion of the target substrate that receives fewer light beams is located at a position where the developing agent has a high concentration, so as to increase the critical dimension at the region where an actual critical dimension is smaller than a desired critical dimension, and reduce the critical dimension at the region where an actual critical dimension is greater than the desired critical dimension. As a result, it is able to make an evenness value of the critical dimension on the target substrate greater than the predetermined value, thereby to increase the evenness of the critical dimension.

It should be appreciated that, the above-mentioned embodiments are for illustrative and explanatory purposes only, but shall not be used to limit the scope of the present disclosure. The above embodiments and the features in the embodiments may be combined in any way in the case of no conflict.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A mask plate, comprising a base plate and a plurality of patterns with openings arranged on the base plate, wherein
   the base plate comprises a first region corresponding to a position where a developing agent has a low concentration in the case that a target substrate is to be developed, and a second region corresponding to a position where the developing agent has a high concentration in the case that the target substrate is to be developed; and
   in the case that the target substrate is exposed using the mask plate, an amount of light beams passing through each pattern at the first region of the base plate is greater than an amount of the light beams passing through each pattern at the second region of the base plate, to compensate for a critical dimension at a position corresponding to the second region through the excessive light beams at the first region, thereby to enable an evenness value of the critical dimension to be greater than a predetermined value.

2. The mask plate according to claim 1, wherein an opening width of each pattern at the first region is greater than that of each pattern at the second region.

3. An exposure device, comprising a mask plate, wherein
   the mask plate comprises a base plate and a plurality of patterns with openings arranged on the base plate;
   the base plate comprises a first region corresponding to a position where a developing agent has a low concentration in the case that a target substrate is to be developed, and a second region corresponding to a position where the developing agent has a high concentration in the case that the target substrate is to be developed; and
   in the case that the target substrate is exposed using the mask plate, an amount of light beams passing through each pattern at the first region of the base plate is greater than an amount of the light beams passing through each pattern at the second region of the base plate, to compensate for a critical dimension at a position corresponding to the second region through the excessive light beams at the first region, thereby to enable an evenness value of the critical dimension to be greater than a predetermined value.

4. The exposure device according to claim 3, wherein an opening width of each pattern at the first region is greater than that of each pattern at the second region.

5. The exposure device according to claim 3, further comprising a color filter arranged on each pattern, wherein a light transmittance of the color filter corresponding to the first region is greater than that of the color filter corresponding to the second region.

6. The exposure device according to claim 3, further comprising a projection module configured to project the light beams toward the first region and the second region in such a manner that the amount of the light beams passing through each pattern at the first region of the base plate is greater than the amount of the light beams passing through each pattern at the second region of the base plate.

7. The exposure device according to claim 6, wherein the base plate further comprises a third region and a fourth region, an opening width of each pattern at the third region of the base plate is greater than an opening width of each pattern at the fourth region of the base plate, and an intensity of the light beam projected by the projection module toward the third region is less than that of the light beam projected toward the fourth region.

8. An exposure method, comprising a step of exposing, by the exposure device according to claim 3, a target substrate, wherein the target substrate comprises a fifth region and a sixth region, an amount of light beams received at the fifth region is greater than an amount of the light beams received at the sixth region, and the fifth region corresponds to the first region of the mask plate, and the sixth region corresponds to the second region of the mask plate.

9. The exposure method according to claim 8, further comprising a developing step of developing the exposed target substrate.

10. The exposure method according to claim 9, wherein the developing step comprises placing the target substrate into a developing agent in such a manner that a distance between the fifth region of the target substrate and a liquid level of the developing agent is greater than a distance between the sixth region of the target substrate and the liquid level of the developing agent.

\* \* \* \* \*